(12) United States Patent
Miyazaki et al.

(10) Patent No.: US 7,692,297 B2
(45) Date of Patent: Apr. 6, 2010

(54) SEMICONDUCTOR DEVICE, SEMICONDUCTOR DEVICE MODULE AND METHOD OF MANUFACTURING THE SEMICONDUCTOR DEVICE

(75) Inventors: Takashi Miyazaki, Kanagawa (JP); Takuo Funaya, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 972 days.

(21) Appl. No.: 11/172,783

(22) Filed: Jul. 5, 2005

(65) Prior Publication Data

US 2006/0012038 A1   Jan. 19, 2006

(30) Foreign Application Priority Data

Jul. 8, 2004   (JP) .............................. 2004-201648

(51) Int. Cl.
*H01L 23/48* (2006.01)
*H01L 23/52* (2006.01)
*H01L 29/40* (2006.01)

(52) U.S. Cl. .................. 257/737; 257/735; 257/738; 257/E23.068; 257/E21.508; 438/108

(58) Field of Classification Search ................. 438/108; 257/673, 735, 737, 738, E23.068, E21.508
See application file for complete search history.

(56) References Cited

U.S. PATENT DOCUMENTS

| 6,288,439 | B1 * | 9/2001 | Bandou ................... 257/666 |
| 2002/0187591 | A1 * | 12/2002 | Bai ............................ 438/126 |
| 2004/0253803 | A1 * | 12/2004 | Tomono et al. ............. 438/614 |
| 2005/0127489 | A1 * | 6/2005 | Mallik et al. ................ 257/686 |
| 2005/0206010 | A1 * | 9/2005 | Noquil et al. ............... 257/778 |

FOREIGN PATENT DOCUMENTS

| JP | 09-232506 | 9/1997 |
| JP | 2002-009110 | 1/2002 |
| JP | 2002-0262238 | 1/2002 |
| JP | 2002-183044 | 6/2002 |
| JP | 2002-231749 | 8/2002 |
| JP | 2003-017655 | 1/2003 |
| JP | 2004-087750 | 3/2004 |

* cited by examiner

*Primary Examiner*—Michelle Estrada
(74) *Attorney, Agent, or Firm*—Young & Thompson

(57) ABSTRACT

A reliable semiconductor device including support bumps so as to adequately seal the region between the chips is to be provided. The semiconductor device includes a semiconductor chip; a bump formed on an upper face of the semiconductor chip; and a plurality of support bumps formed along a circumference of the region where the bump is provided, formed on the upper face of the semiconductor chip; and a flow path for a sealing resin is provided between the plurality of support bumps, so as to connect the region where the bump is provided and a periphery region of the semiconductor chip.

14 Claims, 12 Drawing Sheets

SEMICONDUCTOR DEVICE, SEMICONDUCTOR DEVICE MODULE AND METHOD OF MANUFACTURING THE SEMICONDUCTOR DEVICE

This application is based on Japanese patent application No. 2004-201648, the content of which is incorporated hereinto by reference.

BACKGROUND OF THE INVENTION

1. Field of the Invention

The present invention relates to a semiconductor device, a semiconductor device module and a method of manufacturing the semiconductor device.

2. Related Art

In accordance with the ongoing reduction in dimensions and weight of electronic devices, demand for micronization of the electronic components to be employed is continuously increasing. On the other hand, the demand for higher performance, such as a high speed operation and larger memory capacity, has also been increasing. Accordingly, an SiP (System in Package) in which a plurality of semiconductor chips electrically connected to one another is integrated has been developed, as a method for system integration at the device level that can satisfy both of the micronization in dimensions and higher performance.

A primary part of the SiP technique is a Chip-On-Chip combination technique, which includes disposing so as to oppose each main face of devices having a different optimum designing parameter in a wafer process, such as a CMOS logic and a DRAM, or devices that are difficult to integrate in a wafer process, such as a silicon device and a compound semiconductor device, and electrically connecting the devices via bump electrodes in a shortest distance. Such a Chip-On-Chip technique is expected to achieve a SiP that offers a higher performance and a higher operation speed.

However, some issues to be addressed have already been discovered in such a technique, such as deterioration in strength of each individual bump due to a reduction in size, or difficulty in injecting a sealing resin required for protection from an external environment, which are supposed to come up when still further micronization and improvement in performance are required in future and the bump electrode are compelled to be made smaller.

Therefore, a related art such as JP-A No. 2002-26238 proposes employing a bump for preventing a chip from bending backward, to thereby protect an electrode bump formed according to the chip-on-chip technique. In JP-A No. 2002-26238, an upper chip includes upper bumps arranged along a periphery region of an interconnect forming surface, and a lower chip has lower bumps located at positions corresponding to the upper bumps.

In addition, the lower chip and the upper chip both include, apart from the lower bumps and the upper bumps, a reaction force blocking lower bump and a reaction force blocking upper bump respectively, designed to sustain a reaction force generated by the chip in a direction of bending backward, located at a central portion of the chip or inside the periphery region thereof. When stacking the lower bumps and the upper bumps so as to put the bumps in contact, the reaction force blocking lower bump and the reaction force blocking upper bump are also put into mutual contact.

SUMMARY OF THE INVENTION

However, it has now been discovered that the conventional techniques, including the technique according to the above literature, has a room for improvement in the following aspects.

Firstly referring to FIG. 9, the structure and dimension size of a reaction force receiver bump 7 are restricted, in the case of providing a sealing resin 4 between bumps (upper bumps 2 and lower bumps 6) and between chips (a upper chip 1 and a lower chip 5), after combining them. Usually, a capillary effect is utilized to introduce the sealing resin 4 into a space among the bumps and chips from one of the sides of the upper chip 1, when subsequently injecting the sealing resin 4. However, in case that, the structure and size of the bumps are not uniform, the moving speed of the sealing resin 4 is uneven depending on locations in the region to be sealed, and resultantly a void may be left inside.

Secondly, such restriction on the structure and size of the reaction force receiver bump 7 due to above reason results in vulnerability of the reaction force receiver bump 7 against an external deforming force.

Thirdly, a position to arrange the bumps may be restricted, depending on the type of the chip to be combined by the chip-on-chip technique. For example, in order to form the bumps on a memory cell, a rerouting process has to be performed in addition to an established process. Therefore, the pad electrodes are often disposed in a region other than a region of a memory cell, which generates a restriction that, as in a DRAM chip 8 shown in FIG. 10, bumps 2 can only be located in a central portion of the DRAM chip 8, since memory cell regions 9 are formed along a periphery region thereof. When the bumps 2 are thus concentrated in a central region of the DRAM chip 8, supporting members that sustain a peripheral portion of an upper chip are unavailable when performing the chip-on-chip combination technique by a flip chip method. Consequently, the upper chip may be inclined and thereby damaged, during the chip-on-chip technique process.

Further, in a logic chip including DRAM in recent year, arrangement of an internal interconnect on a memory cell is restricted. Accordingly, such a chip is not free from the foregoing problem either.

For supporting an upper chip, a technique of providing a dummy bump that supports the chip has been proposed, for example in JP-A No. 2002-26238 described above. However, when the position that the bumps are formed is restricted in a central region of the chip, simply applying the technique of JP-A No. 2002-26238 makes it difficult to introduce a sealing resin after the flip chip bonding, since the dummy bumps are disposed around the bumps.

According to the present invention, there is provided a semiconductor device comprising: a semiconductor chip; a bump formed on an upper face of the semiconductor chip; a plurality of support bumps formed along a circumference of a region where the bump is provided, formed on the upper face of the semiconductor chip; and a flow path for a sealing resin provided between the plurality of support bumps so as to connect the region where the bump is provided and a periphery region of the semiconductor chip.

In the present invention, the support bump herein refers to a bump that serves as a support member for another bump, when bonding semiconductor chips via the bumps.

In the semiconductor device thus constructed, the support bump can be provided even when the bumps are provided around a central region of the semiconductor chip. Also, by providing the flow path for a sealing resin between the region where the bumps are provided and the periphery region of the semiconductor chip, it is possible to introduce the sealing resin uniformly and thereby to suppress generation of a void in the sealing resin. Consequently, a semiconductor device with higher reliability can be provided.

According to the present invention, there is provided a semiconductor device module comprising two or more semiconductor devices according to the present invention formed in multilayer, wherein, in at least a pair of semiconductor devices among the semiconductor devices, the bump provided on one of the pair of semiconductor devices and the bump provided on the other of the pair are in contact with each other.

The semiconductor device thus constructed, in which at least two semiconductor devices having a bump are formed such that the bumps contact each other, achieves a combination of the semiconductor devices that have the above characteristics.

According to the present invention, there is provided a method for manufacturing a semiconductor device, comprising: preparing a first semiconductor chip; forming a first bump on an upper face of the first semiconductor chip and forming a plurality of first support bumps along a circumference of a region where the first bump is provided, on the upper face of the first semiconductor chip, and forming a flow path for a sealing resin between the first support bumps, so as to connect a region where the first bump is provided and a periphery region of the first semiconductor chip; introducing a sealing resin on the first semiconductor chip; preparing a second semiconductor chip; forming a second bump on an upper face of the second semiconductor chip and forming a plurality of second support bumps along a circumference of a region where the second bump is provided, on the upper face of the second semiconductor chip, and forming a flow path for a sealing resin between the plurality of second support bumps, so as to connect a region where the second bump is provided and a periphery region of the second semiconductor chip; and sealing the first semiconductor chip and the second semiconductor chip with the sealing resin, with the first bump and the second bump disposed in contact with each other and with the plurality of first support bumps and the plurality of second support bumps respectively disposed in contact with each other.

According to such method, the support bump can be provided even when the first bumps are provided around a central region of the first semiconductor chip. Also, by providing the flow path for a sealing resin between the region where the first bumps are provided and the periphery region of the first semiconductor chip, it is possible to introduce the sealing resin uniformly and thereby to suppress generation of a void in the sealing resin. Further, the first semiconductor ship and the second semiconductor can be sealed with the first bump and the second bump contacting each other, and with the plurality of first support bumps and the plurality of second support bumps respectively contacting each other. Consequently, a semiconductor device with higher reliability can be provided.

According to the present invention, a semiconductor chip with high reliability including a structure of support bumps so as to adequately seal the region between the chips using sealing rejin can be obtained.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereunder, an embodiment of the present invention will be described referring to the accompanying drawings. Throughout the drawings, similar constituents are given an identical numeral, and detailed description thereof will be not presented where appropriate.

Figure 1A:
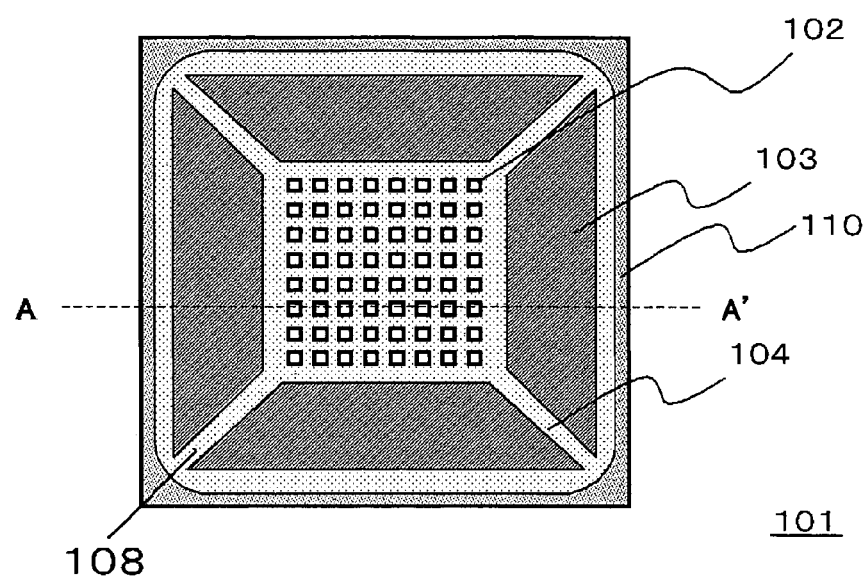
FIG. 1A is a schematic plan view showing a structure of an unbonded upper chip, in a semiconductor device according to an embodiment of the present invention.
Figure 1B:
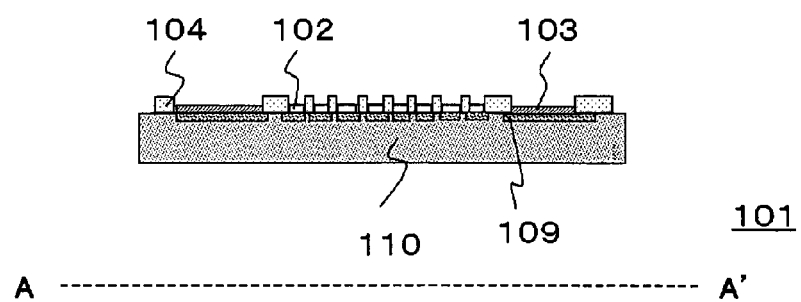
FIG. 1B is a cross-sectional view taken along the line A-A' of FIG. 1A.

A semiconductor device shown in FIGS. 1A and 1B includes a semiconductor chip (upper chip 101); a bump (upper bump 102) formed on an upper face of the semiconductor chip; a plurality of support bumps (support upper bumps 103) formed along a circumference of a region where the bump is provided, formed on the upper face of the semiconductor chip; and a flow path for a sealing resin (sealing resin flow path 108) provided between the plurality of support bumps so as to connect the region where the bump is provided and a periphery region of the semiconductor chip.

Figure 2A:
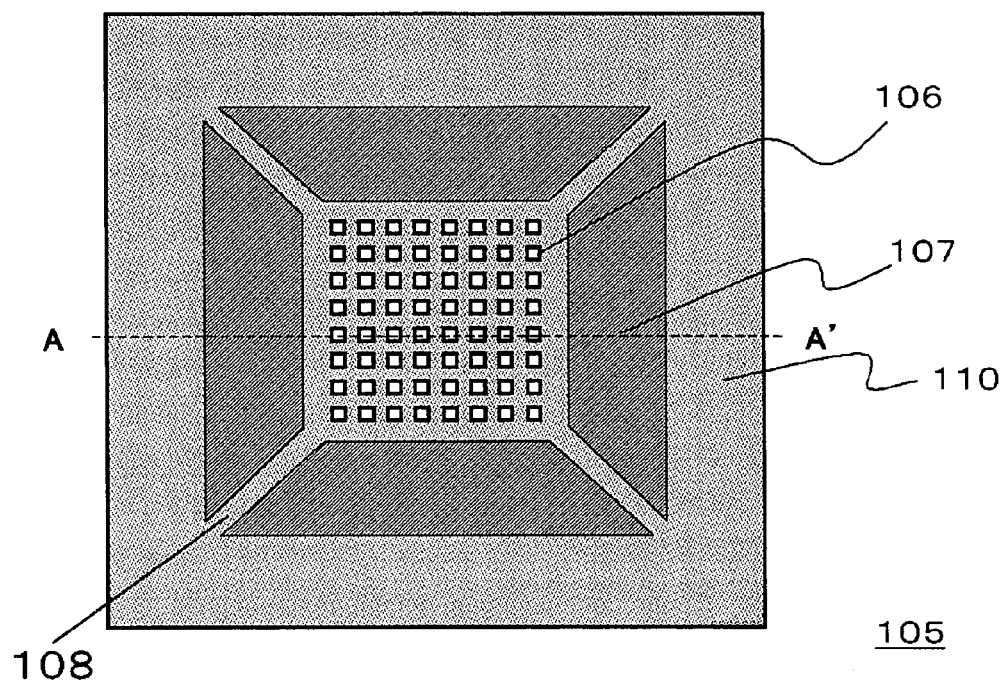
FIG. 2A is a schematic plan view showing a structure of an unbonded lower chip, in the semiconductor device according to the embodiment.
Figure 2B:
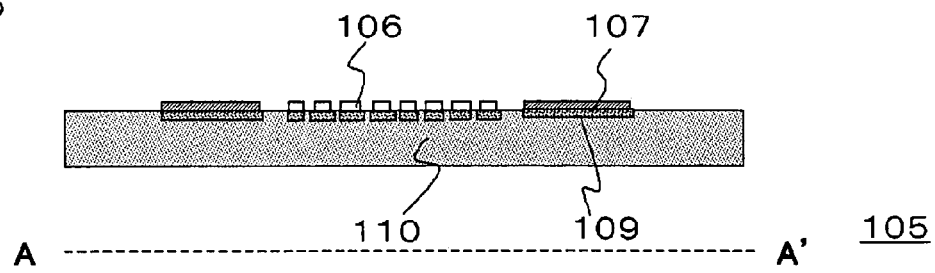
FIG. 2B is a cross-sectional view taken along the line A-A' of FIG. 2A.

A semiconductor device shown in FIGS. 2A and 2B includes a semiconductor chip (lower chip 105); a bump (lower bump 106) formed on an upper face of the semiconductor chip; a plurality of support bumps (support lower bumps 107) formed along a circumference of a region where the bump is provided, formed on the upper face of the semiconductor chip; and a flow path for a sealing resin (sealing resin flow path 108) provided between the plurality of support bumps so as to connect the region where the bump is provided and a periphery region of the semiconductor chip.

Figure 3:
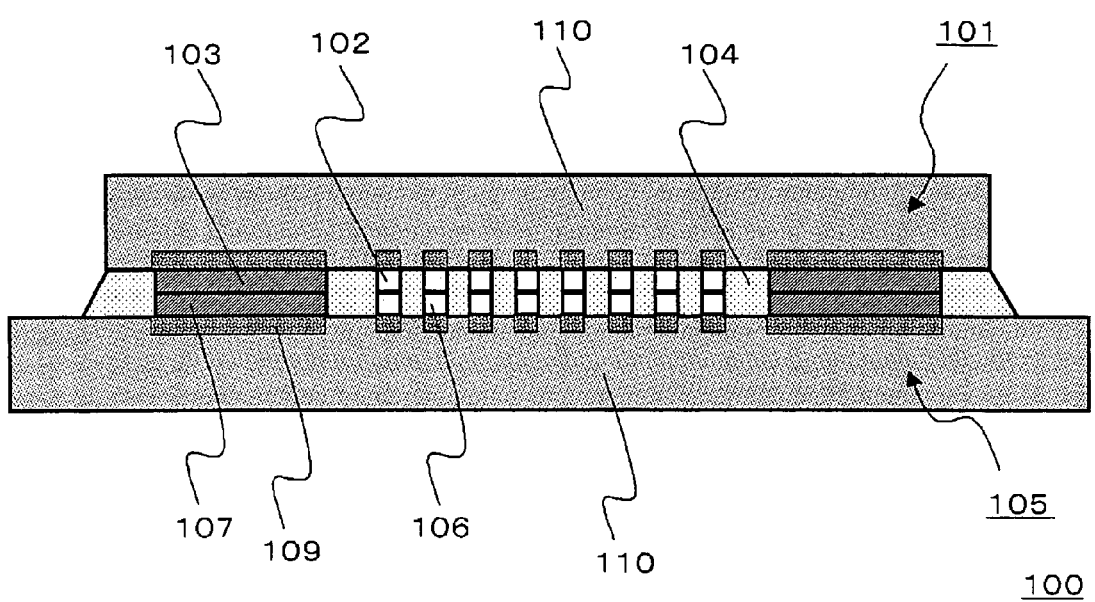
FIG. 3 is a schematic cross-sectional view showing the upper chip and the lower chip bonded, in the semiconductor device according to the embodiment.

In a multi-layered chip 100 shown in FIG. 3, in at least a pair of semiconductor devices among the semiconductor devices that at least two semiconductor devices (upper chip 101 and lower chip 105) are formed, the bump (upper bump 102) provided on one (upper chip 101) of the pair of semiconductor devices and the bump (lower bump 106) provided on the other (lower chip 105) of the pair are in contact with each other.

A method for manufacturing the multi-layered chip 100 shown in FIGS. 5A to 6G includes preparing a first semiconductor chip (upper chip 101); forming a first bump (upper bump 102) on an upper face of the first semiconductor chip and forming a plurality of first support bumps (support upper bumps 103) along a circumference of a region where the first bump is provided, on the upper face of the first semiconductor chip, and forming a flow path for a sealing resin (sealing resin flow path 108) between the first support bumps, so as to connect a region where the first bump is provided and a periphery region of the first semiconductor chip; introducing a sealing resin 104 on the first semiconductor chip; preparing a second semiconductor chip (lower chip 105); forming a second bump (lower bump 106) on an upper face of the second semiconductor chip and forming a plurality of second support bumps (support lower bumps 107) along a circumference of a region where the second bump is provided, on the upper face of the second semiconductor chip, and forming a flow path for a sealing resin (sealing resin flow path 108) between the plurality of second support bumps, so as to connect a region where the second bump is provided and a periphery region of the second semiconductor chip; and sealing the first semiconductor chip and the second semiconductor chip with the sealing resin 104, with the first bump and the second bump disposed in contact with each other and with the plurality of first support bumps and the plurality of second support bumps respectively disposed in contact with each other.

FIGS. 1A, 1B and FIGS. 2A, 2B illustrate a structure of the semiconductor device according to this embodiment. In the present embodiment, a photosensitive resin is employed as the sealing resin 104.

FIGS. 1A and 1B are views showing a structure of the upper chip 101, which is a semiconductor chip. FIG. 1A is a plan view of the upper chip 101, while FIG. 1B is a cross-sectional view of the upper chip 101 taken along the line A-A' of FIG. 1A. In a central portion of the upper chip 101, a plurality of upper bumps 102 constituted of for example gold is arranged in contact with pad electrodes 109 provided on a chip wafer 110, and the support upper bumps 103 are provided in a region along a periphery of the rectangular region where the upper bumps 102 are provided, such as a region between the area where the upper bumps 102 are provided and a periphery region of the upper chip 101. For example, as shown in FIG. 1A, the support upper bump 103, representing a support bump constituted of a metal film such as gold, is disposed in four separate portions along each side of the rectangular region where the upper bumps 102 are provided. In FIG. 1A, the cross-sectional area of the support upper bump 103 taken parallel to the face of the upper chip 101 is larger than the cross-sectional area of the upper bump 102 taken parallel to the face of the upper chip 101 (that is the area of the support upper bump 103 is larger than that of the upper bump 102). In the present embodiment, since the support upper bump 103 is in contact with the pad electrode 109, the support upper bump 103 serves for electrical connection between the upper chip 101 and another chip. Further, the support upper bump 103 may be in no contact with the pad electrode 109. In other words, the support upper bump 103 may serve nothing for electrical connection between the upper chip 101 and another chip. As examples of the upper chip 101, a logic chip, a DRAM, or a logic chip including DRAM, in vicinity of periphery region of which a memory cell is often provided, is employed.

On the upper chip 101, flow paths for the sealing resin 104 are radially disposed from a central portion where the upper bumps 102 are provided, so as to connect between the rectangular-shaped region where the upper bumps 102 are provided and the pepiphery region of the upper chip 101. In other words, a region (space) in which the sealing resin 104 can be disposed is provided, between the rectangular-shaped region where the upper bumps 102 are provided in the vicinity of the central portion of the upper chip 101 and the periphery region of the upper chip 101. Accordingly, the sealing resin 104 patterned through an exposure and developing process is selectively disposed between the upper bump 102, between the support upper bump 103, between the upper bumps 102 and the support upper bumps 103, and in a portion of a circumference of the support upper bumps 103 (that is, the periphery region of the upper chip 101). Also, in the present embodiment, the sealing resin 104 is provided on the chip wafer 110 in a greater thickness than the thickness of the upper bumps 102 and the support upper bumps 103. Also, in the present embodiment, the sealing resin 104 is a photosensitive resin.

FIGS. 2A and 2B are views showing a structure of the lower chip 105, which is a semiconductor chip. FIG. 2A is a plan view of the lower chip 105, while FIG. 2B is a cross-sectional view of the lower chip 105 taken along the line A-A' of FIG. 2A. In a central portion of the lower chip 105, a plurality of lower bumps 106 constituted of for example gold is arranged in contact with pad electrodes 109 provided on a chip wafer 110, and the support lower bumps 107 are provided in a region along a periphery of the rectangular-shaped region where the lower bumps 106 are provided, such as a region between the area where the lower bumps 106 are provided and a periphery region of the lower chip 105. For example, as shown in FIG. 2A, the support lower bump 107, representing a support bump constituted of a metal film such as gold, is disposed in four separate portions along each side of the rectangular-shaped region where the lower bumps 106 are provided. In FIG. 2A, the cross-sectional area of the support lower bump 107 taken parallel to the face of the lower chip 105 is larger than the cross-sectional area of the lower bump 106 taken parallel to the face of the lower chip 105 (the area of the support lower bump 107 is larger than that of the lower bump 106). Also, the lower bumps 106 and the support lower bumps 107 are disposed at positions respectively corresponding to the upper bumps 102 and the support upper bumps 103 provided on the upper chip 101. In the present embodiment, since the support lower bump 107 is in contact with the pad electrode 109, the support lower bump 107 serves for electrical connection between the lower chip 105 and another chip. Further, the support lower bump 107 may be in no contact with the pad electrode 109. In other words, the support lower bump 107 may serve nothing for electrical connection between the lower chip 105 and another chip. As examples of the lower chip 105, a logic chip, a DRAM, or a logic chip including DRAM, in vicinity of periphery region of which a memory cell is often provided, is employed.

FIG. 3 is a cross-sectional view showing a multi-layered chip 100 connected electrically the upper chip 101 and the lower chip 105. The upper chip 101 and the lower chip 105 is electrically connected by disposing the upper bumps 102 provided on the upper chip 101 and the lower bumps 106 provided on the lower chip 105 so as to contact each other. Also, the support upper bumps 103 provided on the upper chip 101 and the support lower bumps 107 provided on the lower chip 105 are disposed in contact with each other. Also, in the present embodiment, the support upper bumps 103 and the support lower bumps 107 are disposed in contact with the pad electrode 109, thus to serve for the electrical connection between the upper chip 101 and the lower chip 105, while an embodiment wherein the support bumps are not in contact with the pad electrode 109, and hence not contributing for the electrical connection between the upper chip 101 and the lower chip 105, is also effective according to the present invention. Further, when disposing the upper bump 102 and the lower bump 106 in contact with each other, as well as the support upper bump 103 and the support lower bump 107 in contact with each other, the region around the upper bumps 102, the region around the lower bumps 106, the region around the support upper bumps 103, the region around the support lower bumps 107, and the region between the upper chip 101 and the lower chip 105 are sealed at a time by the sealing resin 104 provided in advance, the region between the upper bumps 102, the region between the support upper bumps 103, the region between the upper bumps 102 and the support upper bumps 103, and a portion of a circumference of the support upper bumps 103 (that is, the periphery region of the upper chip 101) on the side of the upper chip 101.

Here, the sealing resin 104 provided in advance on the upper chip 101 is supplied with a thickness greater than a distance between the lower face of the upper chip 101 and the upper face of the lower chip 105, determined when the upper chip 101 and the lower chip 105 are bonded as shown in FIG. 3. Accordingly, the multi-layered chip 100 has a structure that, when the upper chip 101 and the lower chip 105 are bonded, the sealing resin 104 is moved, and a surplus portion of the sealing resin 104 is moved toward the outside of the upper chip 101 and the lower chip 105 through the sealing resin flow path 108, that is a flow path of the sealing resin 104 provided between the support upper bump 103 and the support lower bump 107.

Figure 4:
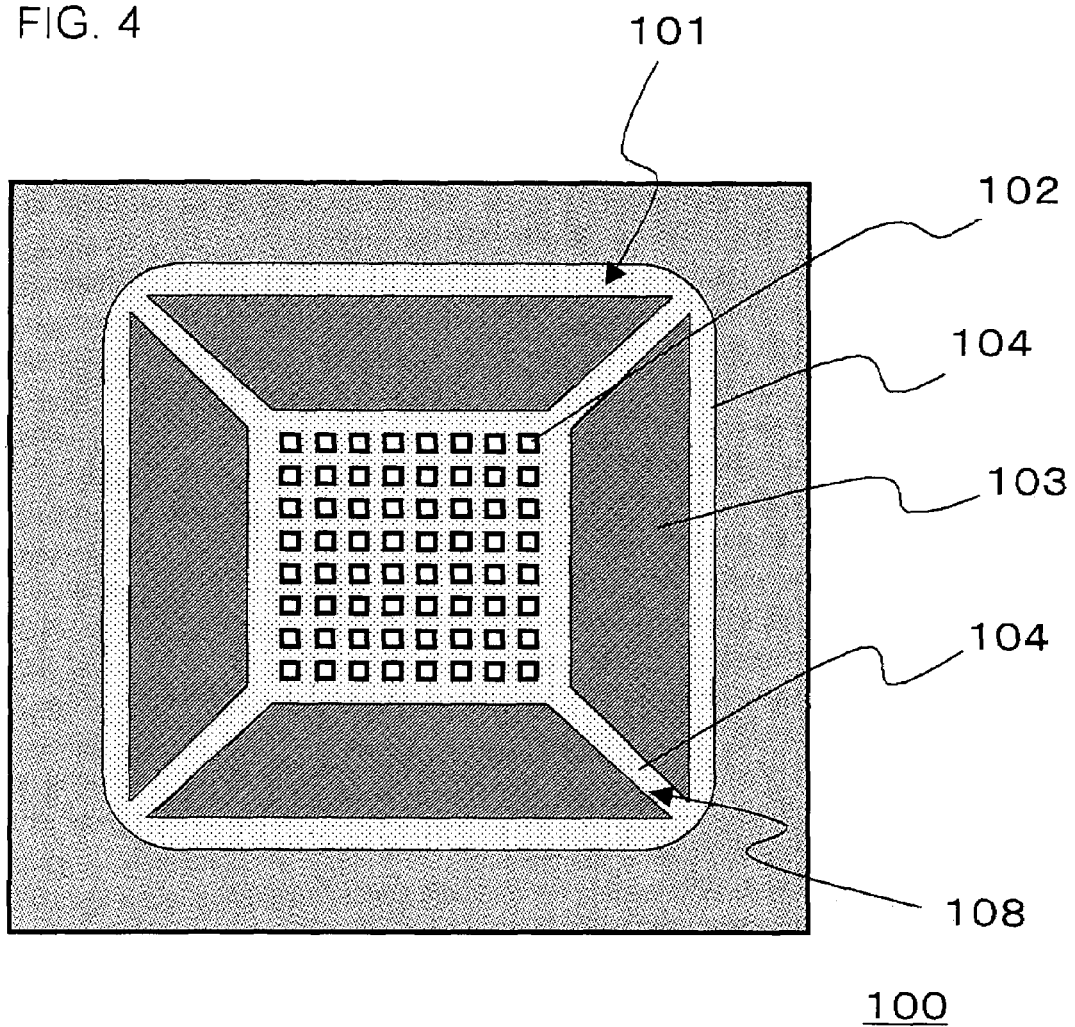
FIG. 4 is a schematic plan view showing the upper chip and the lower chip bonded, in the semiconductor device according to the embodiment.

FIG. 4 is a perspective plan view from the side of the upper chip 101, showing the structure of the multi-layered chip 100 of FIG. 3, which is a chip-on-chip type semiconductor device bonded the upper chip 101 disposed the upper bumps 102, support upper bumps 103 and the photosensitive sealing resin 104, with the lower chip 105 disposed the lower bumps 106, and the support lower bumps 107. As shown in FIGS. 3 and 4, the upper chip 101 and the lower chip 105 are electrically connected, by being connected between the upper bump 102 and the lower bump 106 in contact with each other.

Hereunder, a manufacturing process of the multi-layered chip 100 according to the present embodiment will be described referring to FIGS. 5A to 5D and 6E to 6G. In the present embodiment, it is referred to a case of manufacturing two upper chips 101 as shown in FIGS. 5A to 5D, while one upper chip 101 may be manufactured, or three or more of the upper chips may be manufactured.

Figure 5A:
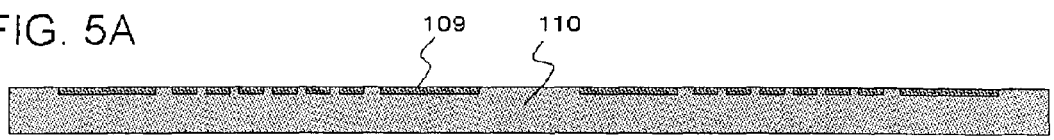
FIGS. 5A to 5D are schematic cross-sectional views for explaining a method of manufacturing the semiconductor device according to the embodiment.

Firstly, referring to FIG. 5A, an upper chip wafer 110 having a pad electrode 109 made of aluminum or the like is prepared.

Figure 5B:
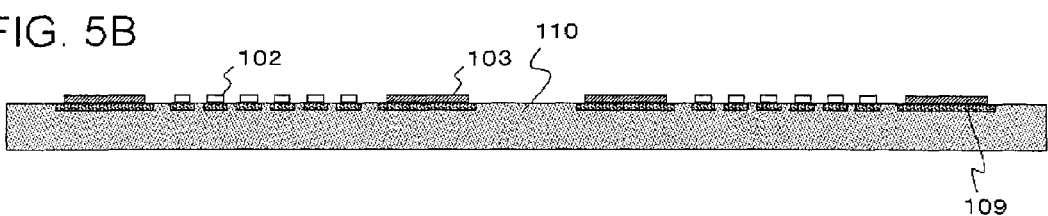

Then, referring to FIG. 5B, an upper bump 102 and a support upper bump 103 are formed on the pad electrode 109 on the upper chip wafer 110, by plating or the like. Here, the support upper bump 103 is provided in a region along a circumstance of a region of for a rectangular-shaped region where the upper bump 102 is provided, such as a region between the area where the upper bump 102 is provided and a periphery region of the upper chip wafer 110 or the like. Also, the upper bump 102 and the support upper bump 103 can be simultaneously formed by a plating technique. In the present embodiment, since the support upper bump 103 is formed on the pad electrode 109, the support upper bump 103 serves to achieve electrical connection between the upper chip 101 (FIG. 1) and another chip. Further, the support upper bump 103 may be in no contact with the pad electrode 109. In other words, the support upper bump 103 may serve nothing for electrical connection between the upper chip 101 and another chip.

Figure 5C:
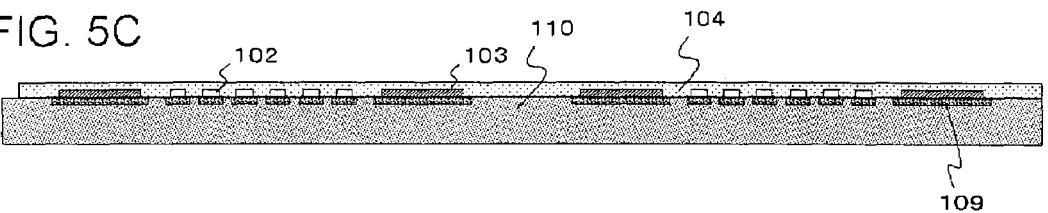

Next, as shown in FIG. 5C, a photosensitive sealing resin 104 is supplied on the chip wafer 110. The sealing resin 104 is supplied so as to cover the upper bump 102 and the support upper bump 103. Here, on the upper chip 101 shown in FIG. 1, a flow path 108 for the sealing resin 104 is provided, so as to connect the region where the upper bump 102 is provided and a periphery region of the upper chip 101. In other words, a region (space) for disposing the sealing resin 104 is provided, in a region between a vicinity of a central portion of the upper chip 101 where the upper bump 102 is provided and a periphery region of the upper chip 101 or the like. Accordingly, the sealing resin 104 can be supplied on a region between the upper bumps 102, a region between the support upper bumps 103, a region between the upper bump 102 and the support upper bump 103, and a portion of the circumference of the support upper bump 103 (periphery region of the upper chip 101). As methods of supplying the sealing resin 104, a spin coating process and a resin sheet forming process is employed.

Figure 5D:
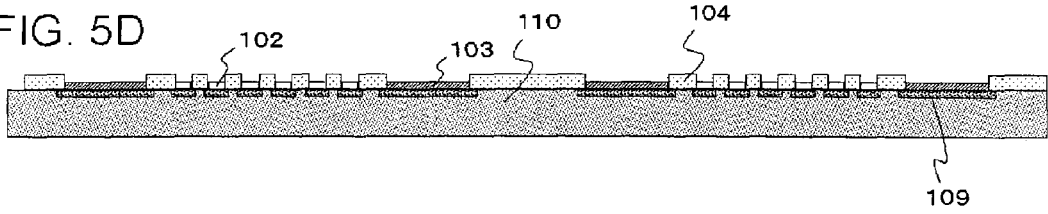

Next, as shown in FIG. 5D, a predetermined patterning is performed by exposure and development of the photosensitive sealing resin 104.

Figure 6E:
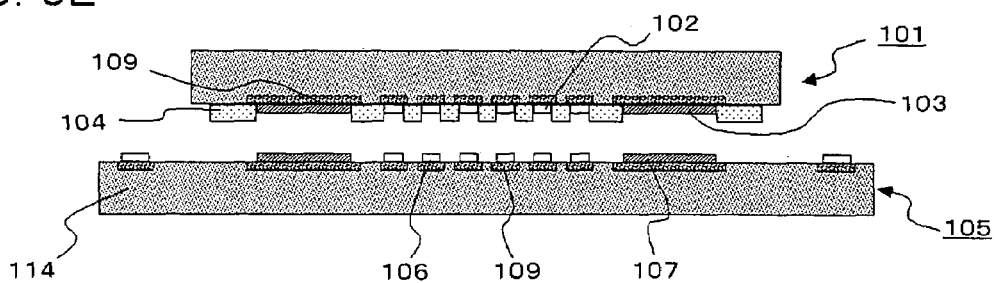
FIGS. 6E to 6G are schematic cross-sectional views for explaining a method of manufacturing the semiconductor device according to the embodiment.

Next, referring to FIG. 6E, a lower chip 105 is prepared. The lower chip 105 is provided with a lower bump 106 and a support lower bump 107, at the respective positions corresponding to the upper bump 102 and the support upper bump 103 on the upper chip 101. The manufacturing process of the bumps on the lower chip 105 is the approximately same as the process for the upper chip 101 described referring to FIGS. 5A and 5B, except that the sealing resin 104 is not supplied.

Figure 6F:
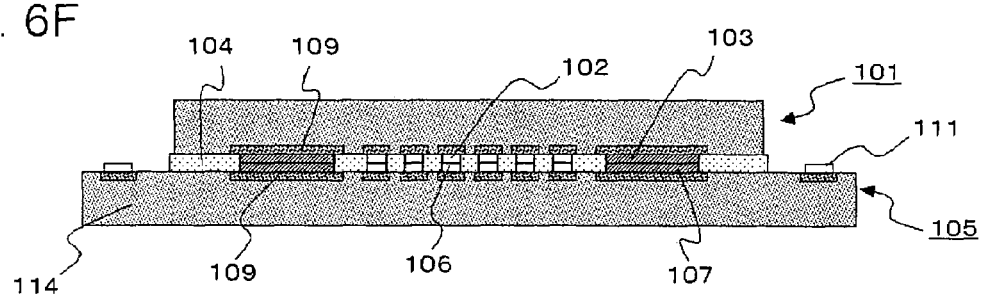

Next, as shown in FIG. 6F, the lower chip 105 and the upper chip 101, which is divided into a single piece by dicing, are bonded via the upper bump 102, the support upper bump 103, the lower bump 106 and the support lower bump 107, and the lower chip 105 and the upper chip 101 are electrically connected. Also, with the sealing resin 104 provided on the side of the upper chip 101, the space between the upper chip 101 and the lower chip 105, the space between the upper bump 102 and the lower bump 106, and the space between the support upper bump 103 and the support lower bump 107 are sealed at a time. More specifically, with the sealing resin 104 provided in advance in a region between the upper bumps 102, a region between the support upper bumps 103, a region between the upper bump 102 and the support upper bump 103, and a portion of a circumference of the support upper bump 103 (periphery region of the upper chip 101), a region around the upper bump 102, a region around the lower bump 106, a region around the support upper bump 103, a region around the support lower bump 107, and a region between the upper chip 101 and the lower chip 105 are simultaneously sealed. Also, when bonding the upper chip 101 and the lower chip 105, the sealing resin 104 is moved so that a surplus portion thereof is moved toward a periphery region of the upper chip 101 and the lower chip 105, through the sealing resin flow path 108 provided for the sealing resin 104 to flow through, between the support upper bumps 103 and between the support lower bumps 107. The surplus portion of the sealing resin 104 then flows toward the outside of the upper chip 101 and the lower chip 105.

Through the above process, the multi-layered chip 100, which is a chip-on-chip type semiconductor device, can be manufactured.

Figure 6G:
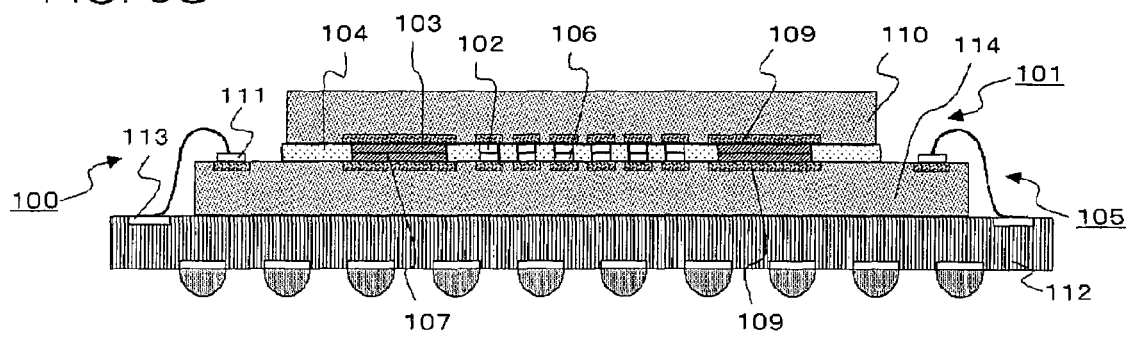

Next, as shown in FIG. 6G, an external electrode 111 provided on a periphery of the lower chip 105 and a substrate electrode 113 provided on the substrate 112 are connected by wire bonding or the like, for packaging.

Hereinafter, there will be described effects of the upper chip 101, the lower chip 105 and the multi-layered chip 100.

In the conventional techniques represented by JP-A No. 2002-26238, there is a problem that the structure and dimensions of a reaction force receiver bump are restricted, in the case of supplying a sealing resin between bumps and between chips, after bonding them. That is, the sealing resin is introduced into a space among the bumps and among the chips from one of the sides of the upper chip by a capillary effect, when subsequently introducing the sealing resin 4. However, if, in this process, the structure and size of the bumps are not uniform, the flow speed of the sealing resin is uneven depending on positions in the region to be sealed, and resultantly a void may be left inside the sealing resin. On the contrary, in the case of the upper chip 101 and the lower chip 105 according to the present embodiment, since the flow path for the sealing resin 104 is provided in a region along a circumference of the section where the upper bumps 102 are provided, such as a region between the section where the upper bump 102 is provided and a periphery region of the upper chip 101, the flow rate of the sealing resin can be substantially at a uniform speed. Therefore, it is possible to suppress generation of a void in the sealing resin 104.

Also, even in the case where it is preferable to provide the bump in a vicinity of a central region on the chip, it is possible to provide the support bump on the chip for the reason that a memory cell is provided in a region vicinity of a periphery region of the chip, as typically seen in a DRAM or a logic chip including DRAM, by providing the support upper bump 103 and the support lower bump 107 between the bumps and a periphery region of the chips. Therefore, it is possible to enlarge a designing margin with respect to the structure and size of the support bump. Also, it is possible to design the structure and size of the support upper bump 103 and the support lower bump 107 comparatively freely. Consequently, the structure and size of the support bump can be designed so as to be strong enough to stand an external deforming force that may be imposed on the multi-layered chip 100, after bonding the upper chip 101 and the lower chip 105.

In the present embodiment, the photosensitive sealing resin 104 is supplied in advance in a region between the upper bumps 102 on the upper chip 101, between the support upper bumps 103 on the upper chip 101, and between the upper bump 102 and the support upper bump 103 on the upper chip 101, so as to cover the upper bump and the support upper bump, and then patterned by exposure and development. Accordingly, when bonding the upper chip 101 and the lower chip 105, since the space between the support upper bumps on the multi-layered chip 100 and between the support lower bumps on the multi-layered chip 100 is filled with the sealing resin 104 which is moved toward in bonding them, generation of a void can be further suppressed.

Figure 7:
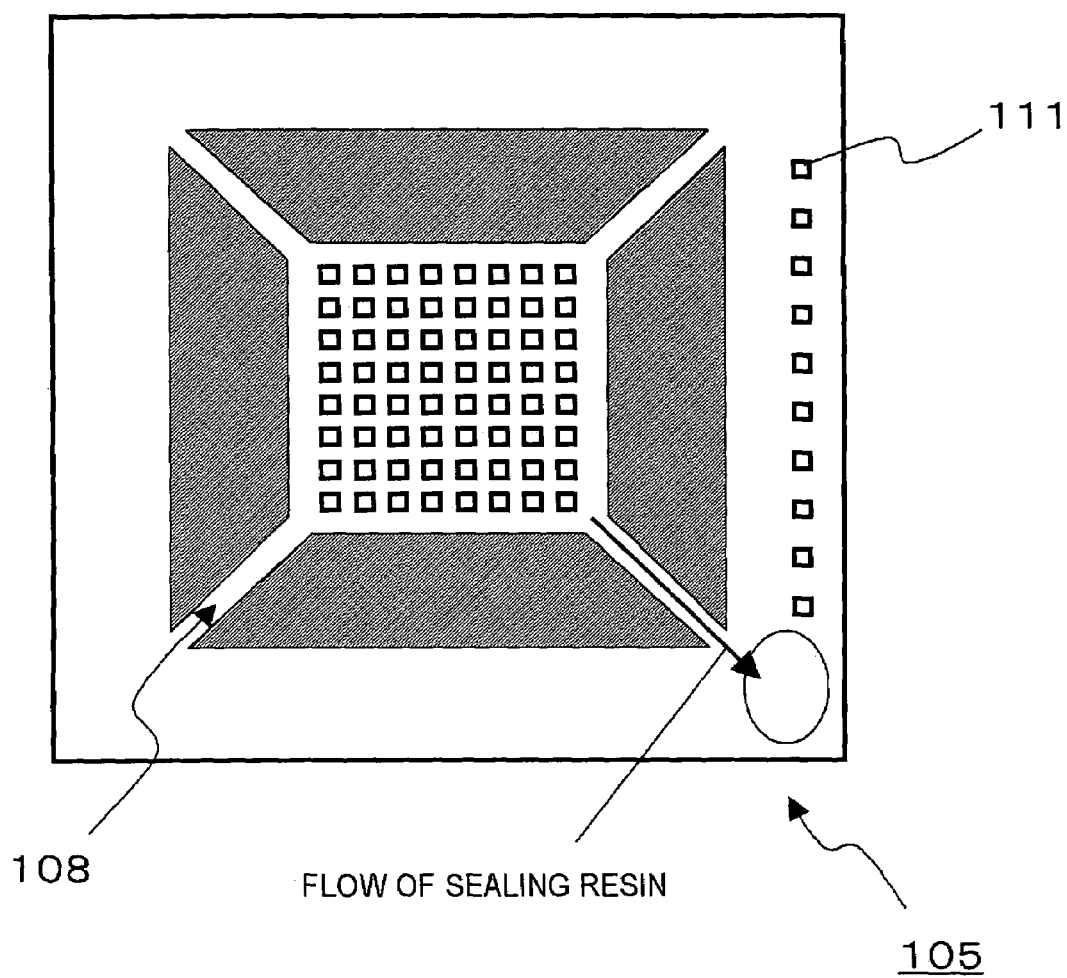
FIG. 7 is a schematic plan view showing the semiconductor device according to the embodiment.

Further, the sealing resin 104 is supplied on the upper chip 101; the support upper bump 103 is provided in a region along a circumference of the area where the upper bumps 102 are provided, such as a region between the area where the upper bump 102 is provided and a periphery region of the upper chip 101; and the support lower bump 107 is provided in a region along a circumstance of the area where the lower bumps 106 are provided, such as a region between the area where the lower bump 106 is provided and a periphery region of the lower chip 105. Accordingly, when bonding the upper chip 101 and the lower chip 105, the sealing resin 104 flows along the sealing resin flow path 108 provided between the support bumps. Therefore, it is possible to control a route on which the sealing resin 104 is to flow and an amount thereof to be moved toward outside of the chip. As a result, as shown in FIG. 7, the sealing resin 104 can be prevented from flowing toward a region where a pad such as the external electrode 111 is provided, on the lower chip 105 bonded with the upper chip 101, therefore, it is further possible to widen designing margin of a position where the external electrode 111 or other pads is provided on a chip such as the lower chip 105.

Although the present invention has been described based on the embodiment shown in the drawings, it is to be understood that they are only exemplary and that various other structure may be employed.

Figure 11:
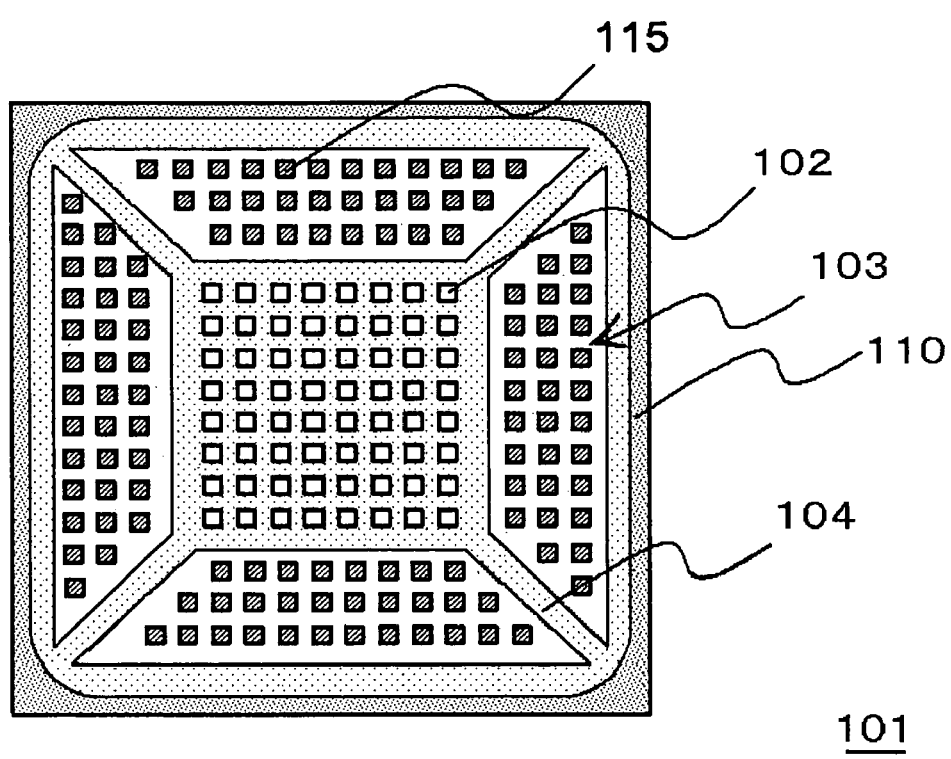
FIG. 11 is a schematic plan view showing a semiconductor device according to another embodiment of the present invention.
Figure 12:
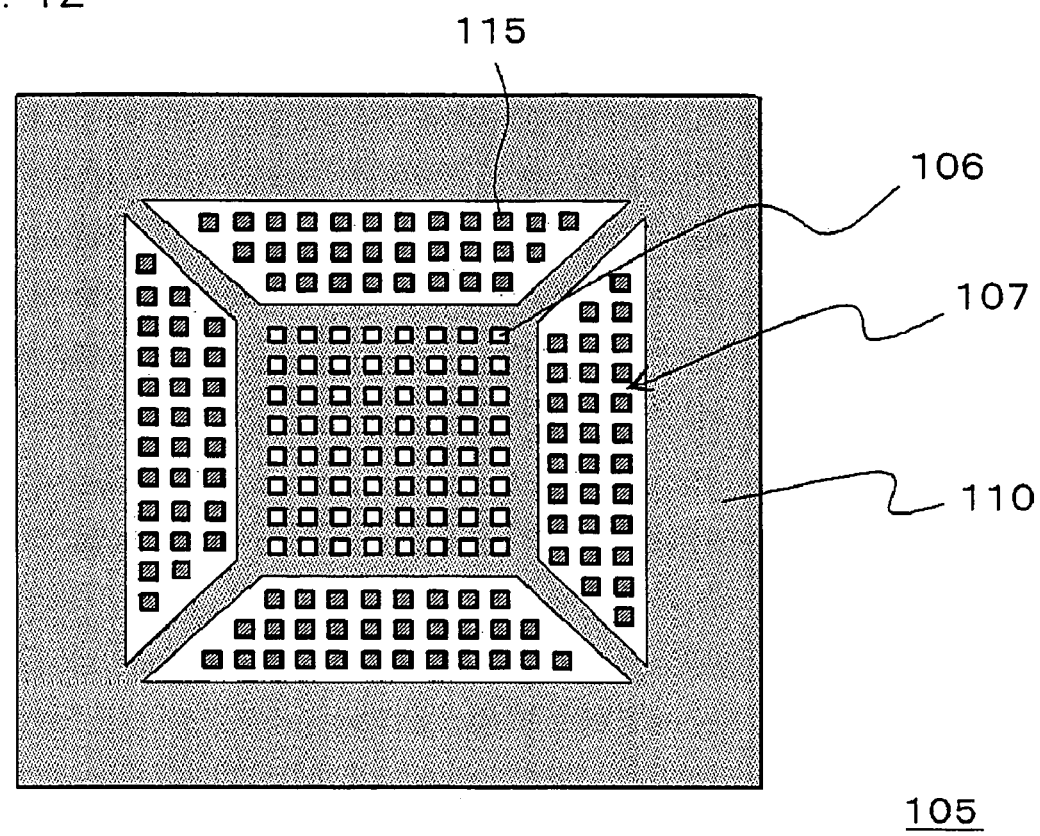
FIG. 12 is a schematic plan view showing a semiconductor device according to another embodiment.

For example, in the above embodiment, the embodiment which four each of support bumps whose area is larger than an area of the bumps are provided in a region between the upper bumps 102 and a periphery region of the upper chip 101, and between the lower bumps 106 and a periphery region of the lower chip 105 is exemplified. As shown in FIGS. 11 and 12, it is suitable that the support upper bump 103 and the support lower bump 107 may be a group of fine bumps 115. Since the support upper-bump 103 and the support lower bump 107 has a structure that is constituted of a group of fine bumps 115, the interface area between the support upper bump 103 and the support lower bump 107 can be reduced, therefore, a load imposed on the upper chip 101 and the lower chip 105 when bonding these chips can be reduced.

Figure 8:
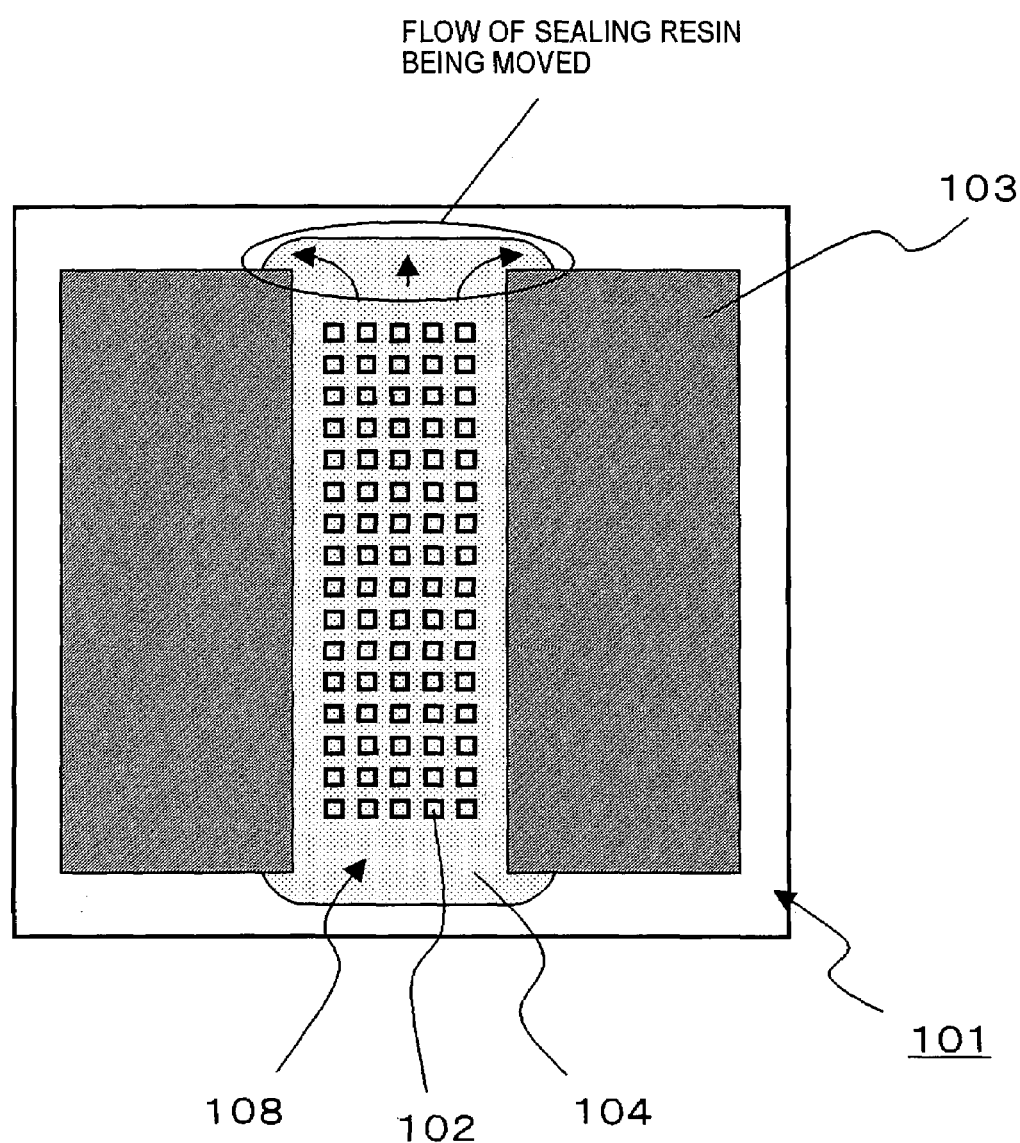
FIG. 8 is a schematic plan view showing the semiconductor device according to the embodiment.
Figure 9:
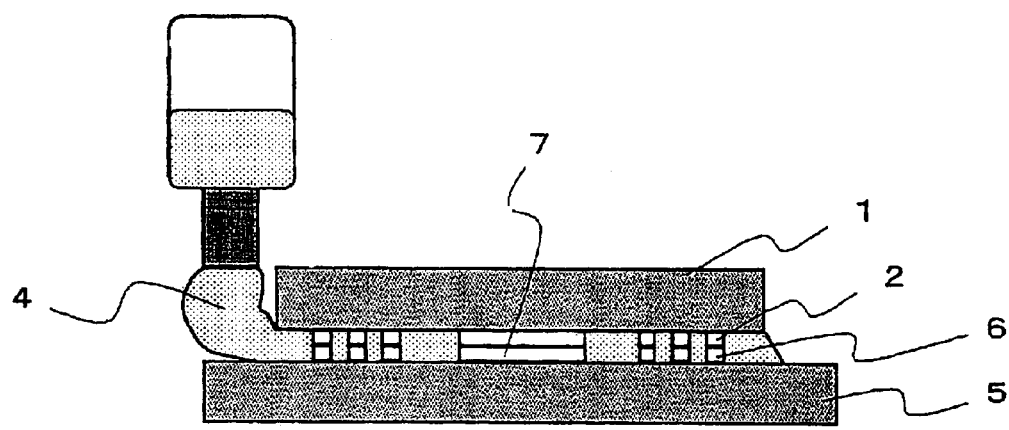
FIG. 9 is a schematic cross-sectional view showing a structure of a conventional semiconductor device.
Figure 10:
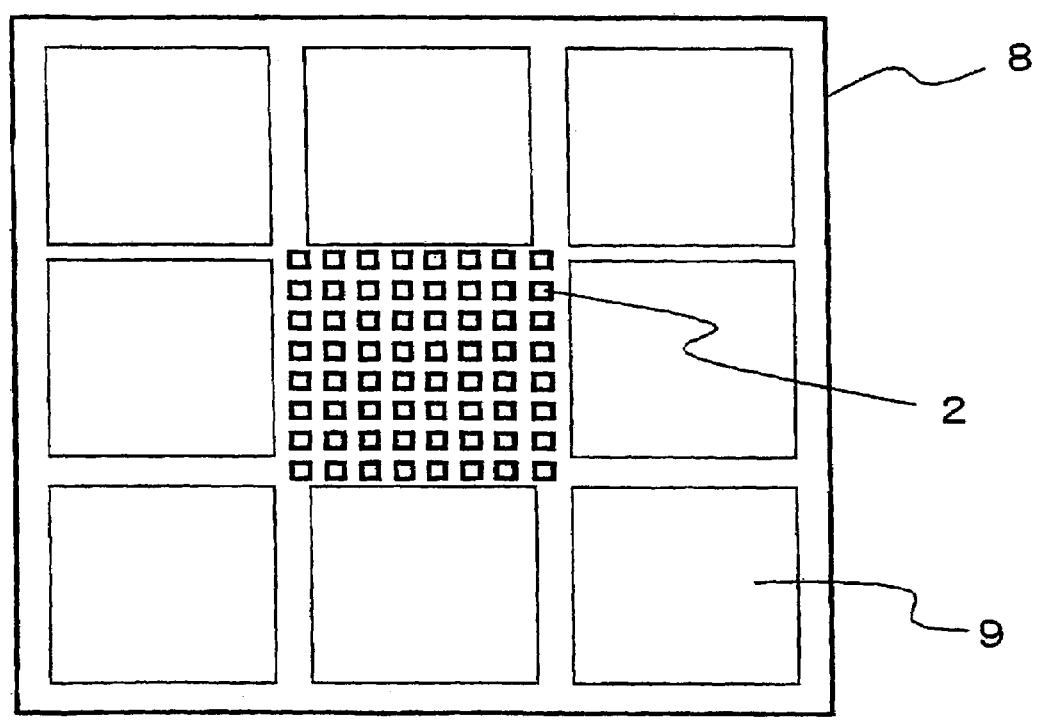
FIG. 10 is a schematic plan view showing a structure of a conventional semiconductor device.

Also, as shown in FIG. 8, two support upper bumps 103 may be provided in a region between a rectangular-shaped section where the upper bumps 102 are provided and a periphery region of the upper chip 101, on the respective sides of the rectangular section where the upper bumps 102 is provided. As well as the upper chip 101, also in the lower chip 105, two such support bumps may be provided. Further, the upper chip 101 and the lower chip 105 may have three or more support bumps.

While the upper bump 102 and the support upper bump 103 are constituted of a same material in the above embodiment, the upper bump 102 and the support upper bump 103 may be constituted of a different material, such as gold for the upper bump 102 and copper for the support upper bump 103. Also, while the lower bump 106 and the support lower bump 107 are constituted of a same material in the above embodiment, the lower bump 106 and the support lower bump 107 may be constituted of a different material, such as gold for the lower bump 106 and copper for the support lower bump 107.

Further, while in the above embodiment, the support upper bump 103 and the support lower bump 107 made of a metal film such as copper is employed, a fusible metal bump may be employed to constitute the support upper bump 103 and the support lower bump 107. A fusible metal bump is constituted of a metal material such as a thermofusible solder such as Sn—Ag or Sn (for instance, a lead-free solder), and by employing the fusible metal bump, the adhesive characteristics between the support upper bump 103 and the support lower bump 107 can be increased. Having such configuration, it is further possible to reduce a load imposed on the upper chip 101 and the lower chip 105 when bonding these chips. Consequently, a support bump having a larger area can be bonded with a lower load.

Further, while the support upper bump 103 and the support lower bump 107 are in contact with the pad electrode 109, thereby serving to achieve electrical connection between the upper chip 101 and another chip, as well as between the lower chip 105 and another chip in the above embodiment, it is not always necessary that the support upper bump 103 and the pad electrode 109, and the support lower bump 107 and the pad electrode 109 are contact with each other respectively. In this case, the support upper bump 103 does not contribute for the electrical connection between the upper chip 101 and another chip, and the support lower bump 107 does not contribute for the electrical connection between the lower chip 105 and another chip. Also, the support upper bump 103 may be in contact with the pad electrode 109 and the support lower bump 107 may not be in contact with the pad electrode 109, or the support upper bump 103 may not be in contact with the pad electrode 109 and the support lower bump 107 may be in contact with the pad electrode 109.

In addition, when the support upper bump 103 and the support lower bump 107 are not provided on the pad electrode 109, the support upper bump 103 and the support lower bump 107 may be provided on an insulating layer made of a polyimide or the like, applied on the chip wafer 110.

Further, while a photosensitive resin is employed as the sealing resin 104 in the above embodiment, a sealing resin, which does not have photosensitive characteristics, may be employed.

Still further, while the upper bump 102 and the lower bump 106 are formed in a rectangular-shaped region in the above embodiment, the upper bump 102 and the lower bump 106 may be disposed in a differently shaped region, such as a circular region, other than the rectangular-shaped region.

Still further, while a surplus region is provided in a circumference of the support upper bump 103 and the support lower bump 107 in the above embodiment, the outer periphery of the support upper bump 103 and the support lower bump 107 may be contact with an outermost periphery portion of the upper chip 101 and the lower chip 105.

Still further, while the multi-layered chip 100 includes the upper chip 101 and the lower chip 105 bonded as shown in FIG. 3 in the above embodiment, even if three or more chips may be formed, at least a pair of chips among three or more chips may be in contact with each other to oppose them, thus to be bonded them. For example, three chips may be formed on a substrate, among which a pair of chips constitutes a chip-on-chip type multi-layered chip bonded by being in contact with bumps each other, and the remaining chip may be connected to a substrate such as a printed circuit board by wire bonding. In such a case also, the effects of the multi-layered chip 100 can be equally obtained.

It is apparent that the present invention is not limited to the above embodiment, that may be modified and changed without departing from the scope and spirit of the invention.

What is claimed is:

1. A semiconductor device module comprising at least two semiconductor devices formed in multilayer, each comprising:

a semiconductor chip;
a bump formed on an upper face of said semiconductor chip;
a plurality of support bumps formed along a circumference of a region where said bump is provided, formed on said upper face of said semiconductor chip; and
a flow path for a sealing resin provided between said plurality of support bumps so as to connect said region where said bump is provided and a periphery region of said semiconductor chip,
wherein, in at least a pair of said semiconductor devices, said bump on one of said pair of semiconductor devices and said bump on another one of said pair are in contact with each other, and said support bumps on said one of said pair of semiconductor devices and said support bumps on said another one of said pair are in contact with each other, and
wherein a respective said bump is electrically connected to a corresponding said semiconductor chip; and
said support bumps are not electrically connected to said semiconductor chip.

2. The semiconductor device module according to claim 1, wherein said support bumps are made of a metal film.

3. The semiconductor device module according to claim 1, further comprising an external electrode provided on said semiconductor chip; and wherein said flow path for said sealing resin is provided in a region other than a region where said external electrode is provided.

4. The semiconductor device module according to claim 1, wherein said semiconductor chip is a DRAM; and
said bump is provided on a region where a memory cell of said DRAM is not provided.

5. The semiconductor device module according to claim 1, wherein said semiconductor chip is a logic chip including DRAM; and
said bump is provided in a region where a memory cell of said logic chip including DRAM is not provided.

6. The semiconductor device module according to claim 1, wherein said sealing resin is a photosensitive sealing resin.

7. The semiconductor device module according to claim 1, wherein said support bumps are made of a fusible metal.

8. The semiconductor device module according to claim 7, wherein said fusible metal is a solder.

9. The semiconductor device module according to claim 1, wherein each of said support bumps comprises group of fine bumps.

10. The semiconductor device module according to claim 1, wherein an area of said support bumps is larger than an area of said bump.

11. The semiconductor device module according to claim 1, wherein said support bumps are disposed along each side of a rectangular-shaped region where said bump is provided.

12. The semiconductor device module according to claim 1,
wherein said bump is provided in a rectangular-shaped region formed on an upper face of said semiconductor chip; and
said flow path for said sealing resin is radially disposed from said rectangular-shaped region.

13. The semiconductor device module according to claim 1, wherein a material that constitutes said bump and a material that constitutes said plurality of support bumps are different.

14. The semiconductor device module according to claim 1, wherein said semiconductor chip provided in said one of said pair of semiconductor devices is a logic chip.

* * * * *